United States Patent

Schulz et al.

[11] Patent Number: 5,510,012
[45] Date of Patent: Apr. 23, 1996

[54] METHOD FOR PRODUCING A DECORATIVE GOLD ALLOY COATING

[75] Inventors: Siegfried Schulz, Hanau, Germany; Christoph Daube, Tsukuba, Japan; Alfred Belz, Erlensee; Andreas Rack, Hanau, both of Germany

[73] Assignee: Leybold Aktiengesellschaft, Hanau, Germany

[21] Appl. No.: 888,825

[22] Filed: May 27, 1992

[30] Foreign Application Priority Data

Feb. 19, 1992 [DE] Germany .......................... 42 05 017.0

[51] Int. Cl.⁶ ............................................... C23C 14/34
[52] U.S. Cl. ......................... 204/192.15; 204/192.16
[58] Field of Search ............................ 204/192.15, 192.16

[56] References Cited

U.S. PATENT DOCUMENTS

| | | | |
|---|---|---|---|
| 4,428,811 | 1/1984 | Sproul et al. | 204/192.15 X |
| 4,544,468 | 10/1985 | Munz et al. | 204/192.15 X |
| 4,591,418 | 5/1986 | Snyder | 204/192.16 |
| 4,791,017 | 12/1988 | Hofmann et al. | 428/216 |
| 4,871,434 | 10/1989 | Munz et al. | 204/192.15 X |
| 4,882,022 | 11/1989 | Hoffman et al. | 204/192.15 |

FOREIGN PATENT DOCUMENTS

| | | |
|---|---|---|
| 3425468 | 4/1988 | Germany . |
| 3425467 | 6/1988 | Germany . |
| 9017389 | 4/1991 | Germany . |
| 60-238477 | 11/1985 | Japan . |
| 657154 | 4/1991 | Switzerland . |
| 1326470 | 7/1987 | U.S.S.R. . |
| 900463 | 8/1990 | WIPO . |

OTHER PUBLICATIONS

Edelmetall–Taschenbuch Degussa, Frankfurt am Main, 1967, pp. 111–119.

Primary Examiner—Nam Nguyen
Attorney, Agent, or Firm—Felfe & Lynch

[57] ABSTRACT

For the production of a coating formed by cathode sputtering, a target made from an alloy of gold and preferably vanadium is used. During the cathode sputtering, nitrogen gas is used as the reactive gas. The result is the formation of vanadium nitrides on the substrate to be coated. By varying the nitrogen content, the proportion of the vanadium nitrides can be changed thereby causing the appearance and the hardness of the coating to also change. This change in coating characteristics can accommodate a broad range of requirements avoiding the necessity of using different targets for different coating characteristics.

5 Claims, 2 Drawing Sheets

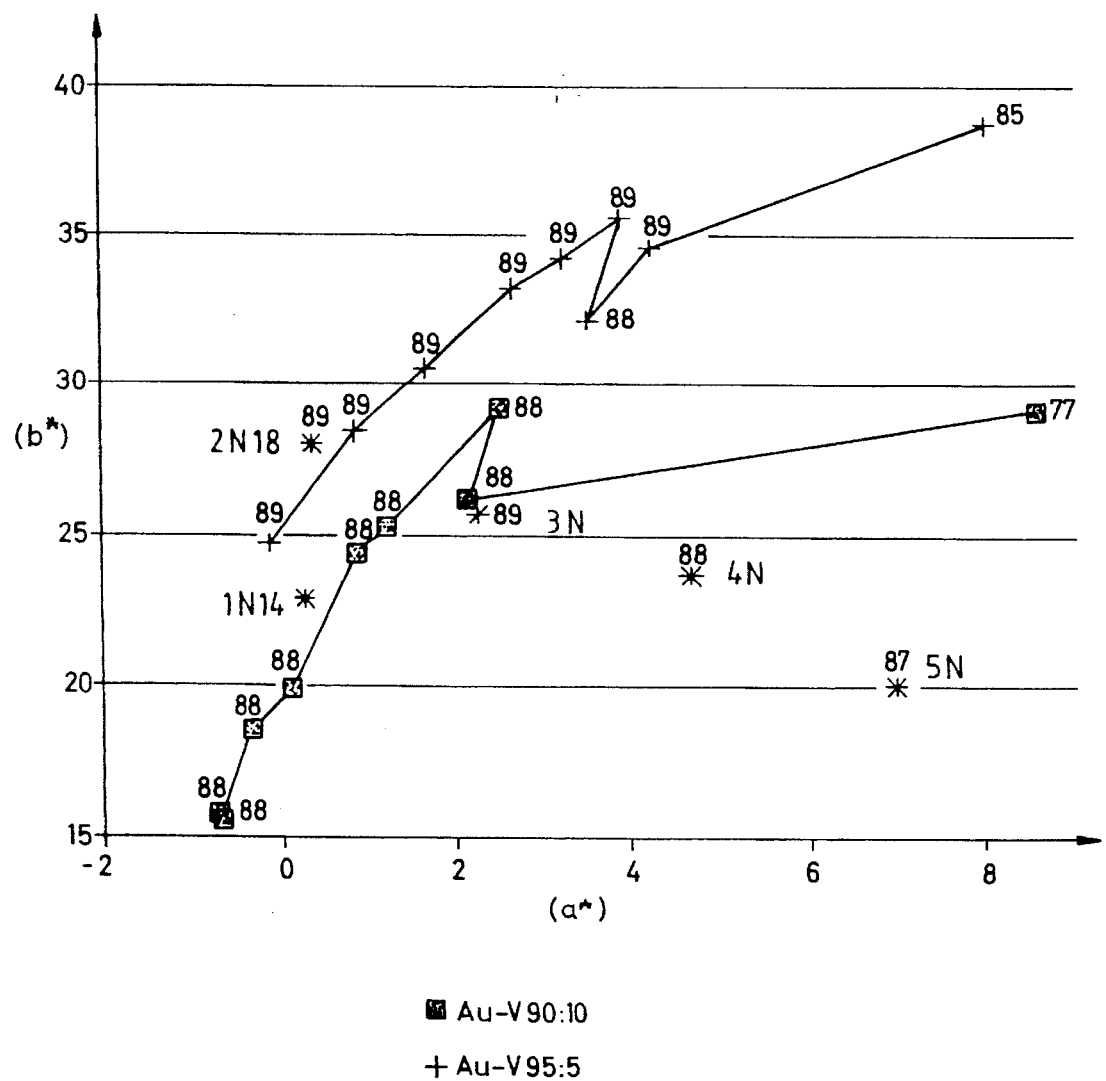

METHOD FOR PRODUCING A DECORATIVE GOLD ALLOY COATING

FIELD OF INVENTION

The invention relates to a method for producing a gold coating on a substrate by means of a PVD process, such as vapor depositing, ion plating or cathode sputtering.

BACKGROUND OF INVENTION

Gold coatings must often have a different appearance or different physical properties for various applications. This has formerly been achieved by sputtering different gold alloys from separate targets to meet the requirements of the various applications. For example, German patent DE-C-28 25 513 teaches that the production of different gold tones by ion plating. The suggested method calls for either varying the thickness of a gold layer applied over a hard layer, or producing the topmost gold layer from a gold alloy which contains various alloying components.

This method however presents some problems. Variation of the thickness of the layer is usually impossible, because a certain thickness is necessary to make the coating of the desired durability. Variations of the composition of the topmost layer require different targets in a cathode sputtering apparatus. If coatings having two different gold standards are to be produced selectively by a cathode sputtering apparatus, for example, then two targets of different gold alloys must be on hand so as to be able to use one or the other target as required. On account of the high cost of such gold alloy targets, the result is an undesirable investment of capital in the multiple targets.

In April 1990, printed literature of Leybold AG mentioned that gold-titanium alloys can be sputtered reactively, so that a coating of gold and titanium nitride is formed. On account of the low brilliance of the coating when alloys of low gold content are used, however, the process had been considered not very promising for decorative purposes.

The invention is addressed to the problem of developing a PVD and similar processes of the kind described above, by which different gold coatings can be applied to a substrate while minimizing expenses through the use of a single target instead of multiple targets for different coating characteristics and properties.

SUMMARY OF THE INVENTION

This problem is solved in accordance with the invention in that the target required for the sputtering of different coatings is in each case made of the same alloy of gold and at least one element chosen from the group made up of titanium, vanadium, chromium, scandium, zirconium, niobium, molybdenum, hafnium, tantalum and tungsten. In order to influence the properties of the coating, the process parameters are varied, especially the concentration and composition of the reactive atmosphere in the coating apparatus or chamber.

By the described procedure it is possible, by varying the content of the reactive gas mixture, to influence the color, the brightness and the hardness of the gold coating applied during the coating process. In this manner it becomes possible with a single alloy, and therefore with less capital tie-up, to produce very different coatings, especially hard, wear-resistant, variable-color, thin coatings. Thus, an extremely economical PVD process is available.

The appearance and the hardness of the gold coating can be varied to an especially great extent within a practically advantageous range if vanadium is used as alloying component and nitrogen as the reactive gas.

The most commonly used Swiss gold standards can be achieved if an alloy of pure gold and approximately 5 to 10 atomic percent of vanadium is used.

An especially durable coating results if the coating according to the invention is applied to a hard-metal layer consisting of titanium nitride, for example, which has been produced by a PVD process from titanium with the use of nitrogen as reactive gas.

These together with other objects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

For the further explanation of the invention, reference is made to the drawings, wherein:

FIG. 2 shows the yellow and red values of the coating for different percentages of the reactive gas.

DETAILED DESCRIPTION OF THE PREFERRED EMBODIMENT

Figure 1:
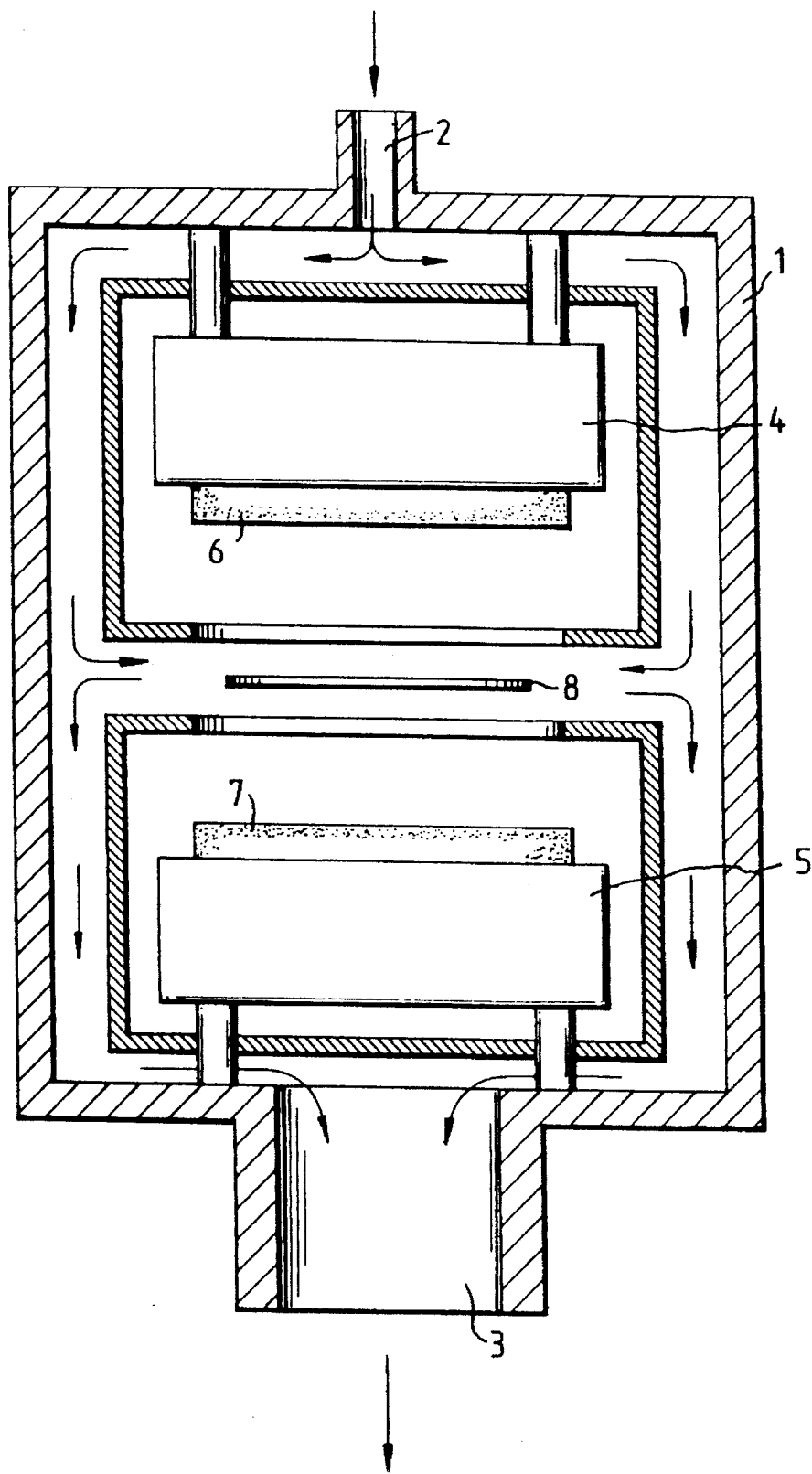
FIG. 1 is a longitudinal section through a cathode sputtering apparatus for the practice of the method according to the invention.

FIG. 1 shows a tank 1 which has a gas inlet 2 on one end and a vacuum connection 3 of substantially larger cross section on the opposite end. On the interior of the tank 1 two cathodes 4 and 5 are facing one another, each with a target 6 and 7 respectively. Between the targets 6 and 7 is a substrate 8 which is to be coated.

The cathode sputtering apparatus can be of conventional construction. It is important to the invention that the targets 6 and 7 consist of a gold alloy, and that during the coating process a reactive gas, preferably nitrogen, is injected through the gas inlet 2 in addition to argon, for the formation of the plasma. The result is that sputtered vanadium is converted to vanadium nitride, so that, as the nitrogen percentage increases, the yellow values and red values plus the hardness of the coating increase due to a higher vanadium nitride content. It has been found, for example, that the Vickers hardness of the coating produced by the method according to the invention, with a target of 10 atomic percent of vanadium, at a flow of 2 ml/min of $N_2$ was 460 $HV_{0.01}$, while at a flow of 1 ml/min of $N_2$ it amounted to only 370 $HV_{0.01}$, and without any input of $N_1$ it was only 229 flow of 2 ml/min, 477 $HV_{0.01}$, at 1 ml/min, 264 $HV_{0.01}$, and without $N_2$ only 185 $HV_{0.01}$.

In the diagram shown in FIG. 2, the yellow values (b*) and red values (a,) in CIE lab units are represented for two coatings produced by the method of the invention. The points of measurement of a coating made from a target alloy of gold and 10 atomic percent of vanadium are indicated by black squares, and those of a coating made with a target alloy of gold and 5 atomic percent of vanadium are indicated by crosses.

The nitrogen flow was increasing along the abscissas in both cases. The brilliance has also been given for all of the plotted points. For comparison, the Swiss gold standards 1N14, 2N18, 3N, 4N and 5N are plotted in the diagram for comparison.

The diagram shows that, with the method according to the invention, coatings of different appearance and of high brilliance can be produced with a single target with simultaneous increase in hardness. Consequently the method is to a high degree suitable for producing decorative coatings.

Although the present invention has been shown and described with respect to preferred embodiments, various changes and other modifications which are obvious to persons skilled in the art to which the invention pertains are deemed to lie within the spirit and scope of the invention.

It is claimed:

1. A method for the application of a gold alloy coating having physical properties on a substrate by means of a PVD process, comprising the steps of:

introducing nitrogen having a concentration and a composition in a reaction chamber;

reactively sputtering onto said substrate a plurality of particles from a target made of gold alloyed with vanadium, whereby said gold alloy coating includes vanadium nitride; and varying said concentration of nitrogen during said sputtering step to influence said physical properties of said gold alloy coating resulting from said sputtering step.

2. Method according to claim 1, wherein said target is an alloy of gold and 5 to 10 atomic percent vanadium.

3. Method according to claim 1, wherein said substrate has a coating of titanium applied prior to said sputtering step.

4. Method according to claim 1 wherein the concentration of nitrogen is increased during said sputtering step.

5. A method for application of a gold alloy coating to a substrate, said method comprising the steps of introducing nitrogen having a concentration into a reaction chamber, sputtering a target comprising gold and vanadium to produce on said substrate a coating comprising gold and vanadium nitride, and increasing said concentration of nitrogen during said sputtering step.

* * * * *